US009837791B1

(12) United States Patent
Brown et al.

(10) Patent No.: US 9,837,791 B1
(45) Date of Patent: Dec. 5, 2017

(54) MULTIFUNCTIONAL CIRCUIT FOR MONITORING FIBER CABLE HEALTH

(71) Applicant: NLIGHT, INC., Vancouver, WA (US)

(72) Inventors: Aaron Brown, Vancouver, WA (US); Aaron Hodges, LaCenter, WA (US); Kenneth Almonte, Portland, OR (US)

(73) Assignee: NLIGHT, INC., Vancouver, WA (US)

( * ) Notice: Subject to any disclaimer, the term of this patent is extended or adjusted under 35 U.S.C. 154(b) by 0 days.

(21) Appl. No.: 15/396,593

(22) Filed: Dec. 31, 2016

Related U.S. Application Data

(60) Provisional application No. 62/344,993, filed on Jun. 3, 2016.

(51) Int. Cl.
| | | |
|---|---|---|
| *H01S 3/04* | (2006.01) | |
| *H01S 5/06* | (2006.01) | |
| *H01S 5/022* | (2006.01) | |
| *H01S 5/068* | (2006.01) | |
| *H01S 5/40* | (2006.01) | |
| *H01S 5/0683* | (2006.01) | |

(52) U.S. Cl.
CPC ........ *H01S 5/0607* (2013.01); *H01S 5/02284* (2013.01); *H01S 5/06* (2013.01); *H01S 5/0612* (2013.01); *H01S 5/06804* (2013.01); *H01S 5/06837* (2013.01); *H01S 5/4012* (2013.01)

(58) Field of Classification Search
CPC ...... H01S 5/02284; H01S 5/0607; H01S 5/06; H01S 5/0612; H01S 5/06804; H01S 5/06837; H01S 5/4012
See application file for complete search history.

(56) References Cited

U.S. PATENT DOCUMENTS

| 9,627,852 B2* | 4/2017 | Hemenway ......... H01S 5/02284 |
|---|---|---|
| 2003/0026557 A1* | 2/2003 | Galeotti ............... G02B 6/4237 385/94 |
| 2004/0151441 A1* | 8/2004 | Bennett .................. G02B 6/421 385/92 |
| 2010/0086253 A1 | 4/2010 | Eyal |
| 2010/0091804 A1* | 4/2010 | Musio ..................... H01S 5/141 372/20 |
| 2012/0280578 A1 | 11/2012 | Stadler |
| 2013/0011102 A1* | 1/2013 | Rinzler ............... G02B 6/3813 385/89 |
| 2013/0182725 A1* | 7/2013 | Karlsen ............. G02B 19/0028 372/6 |
| 2015/0127983 A1 | 5/2015 | Trobough |
| 2015/0323391 A1 | 11/2015 | McCulloch |

OTHER PUBLICATIONS

United States Patent & Trademark Office; International Search Report and Written Opinion for PCT/US2017/035715; dated Aug. 11, 2017; 8 pages.

* cited by examiner

*Primary Examiner* — Kinam Park

(74) *Attorney, Agent, or Firm* — Schwabe, Williamson & Wyatt P.C.

(57) ABSTRACT

Described herein is a fiber laser coupler, comprising a fiber laser cable enclosed in a housing, the housing includes a circuit and a temperature sensitive variable resistance element (TSVRE) coupled to the circuit, wherein the TSVRE is in thermal contact with one or more locations within the housing and is configured to provide a resistance in the circuit associated with a temperature of the TSVRE, wherein the circuit is further configured to couple to a processor configured to determine a temperature of the TSVRE based on reading the resistance in the circuit.

17 Claims, 4 Drawing Sheets

MULTIFUNCTIONAL CIRCUIT FOR MONITORING FIBER CABLE HEALTH

TECHNICAL FIELD

The technology disclosed herein relates to high-power fiber and fiber-coupled lasers. More particularly, the disclosed technology relates to managing excess heat in an optical fiber connector.

BACKGROUND

The use of high-power fiber-delivered lasers is increasing in popularity for a variety of applications such as materials processing, cutting, welding, and/or additive manufacturing. Fiber-coupled lasers include fiber-delivered lasers, disk lasers, diode lasers, direct diode lasers, diode-pumped solid state lasers, and lamp-pumped solid state lasers; fiber-delivered lasers are the most prevalent fiber-coupled laser source. In these systems, optical power is delivered from the laser to a work piece via an optical fiber, which typically includes a connector at the end. Intermediate fibers between the fiber-coupled laser and the work piece may also be employed, and these intermediate fibers also typically include connectors at both ends. These connectors are typically designed to precisely align the beam emerging from the fiber to maintain pointing of the output beam through the downstream optics and to facilitate multiple connection/disconnection cycles. Some problems that may arise in the fiber connectors can result in mechanical breakage of the fiber and/or destruction of the fiber as a result of excess heat which can cause damage to the internal environment in the fiber connector.

Some conventional industrial fiber-delivered lasers systems include simple two-wire circuits (sometimes referred to as "interlock circuits") to monitor and indicate the presence of hazardous conditions in the fiber connector and/or the fiber cable. These simple circuits open when a hazard is recognized and shut the laser off. This interlock circuit is available if the cable is plugged into an appropriate receptacle. When the cable is properly mated to the receptacle, the two wires of the circuit are connected to one another and complete an interlock circuit. These same two wires run the length of the fiber cable and provide additional functionality by opening the circuit when subject to significant mechanical or thermal stress. Such stress may be due to a variety of fiber optic faults that cause burning, or by mechanical means such as being pinched by machinery. In these cases, the fragility of the wires allows them to sever which opens the circuit and safely shuts off the laser system. This system is fairly rigid, is only effective in the event of a catastrophic fault and does not enable resetting the laser system to a functional state.

Other conventional industrial fiber-delivered laser systems offer similar functionality and compatibility, but with the addition of a thermostatic switch located in series with the receptacle contacts. The thermostatic switch is located in the distal (output) head of the fiber cable and will open if the assembly reaches or exceeds some critical temperature that may damage the hardware. Once cooled, the thermostatic switch resets to allow operation of the laser to resume. However, such a system provides no information on the conditions inside the connector prior to a critical event causing shut-down and it does not allow users to manually set temperature thresholds.

BRIEF DESCRIPTION OF THE DRAWINGS

The accompanying drawings, are incorporated in and constitute a part of this specification and, together with the description, explain the advantages and principles of the presently disclosed technology.

DETAILED DESCRIPTION

Figure 1:
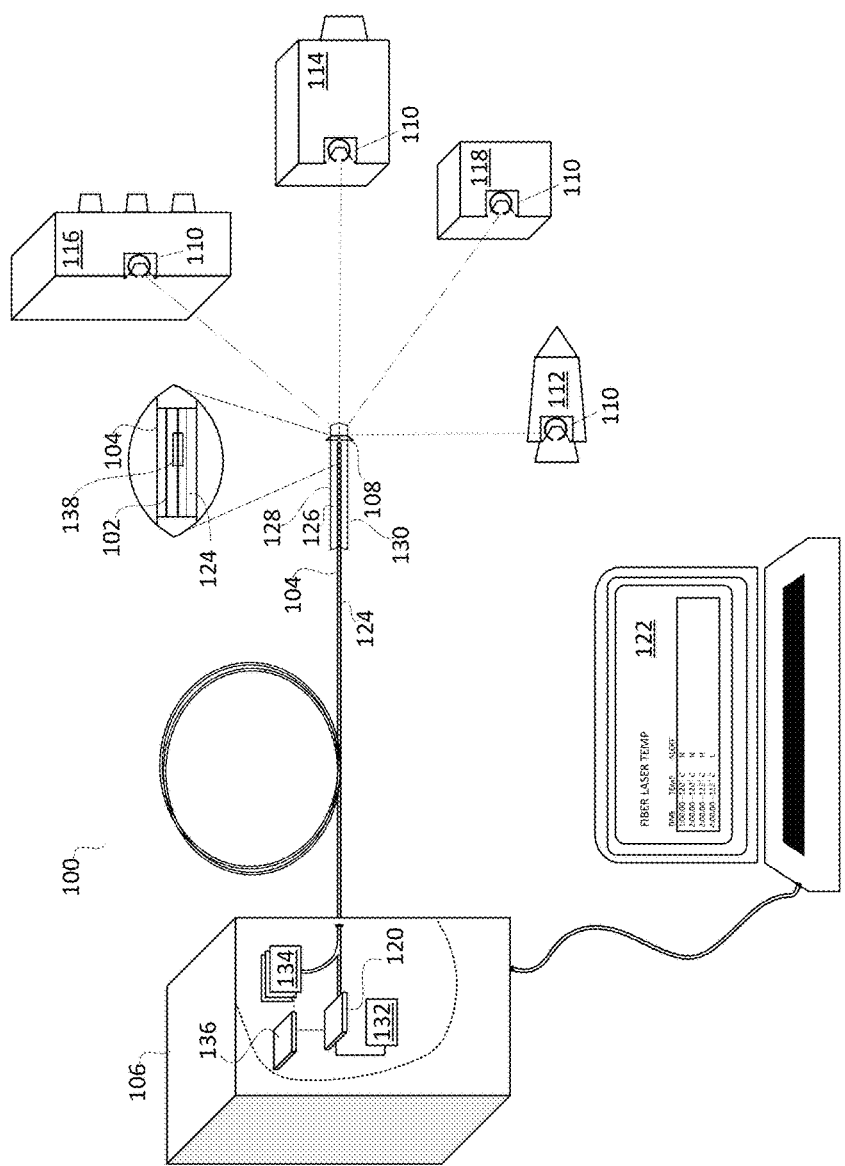
FIG. 1 illustrates an example fiber delivered laser system including a multifunctional two-wire circuit for monitoring fiber cable health comprising a thermistor (or equivalent resistive circuit that varies resistance with temperature)

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections. Examples are described with reference to directions indicated as "above," "below," "upper," "lower," and the like. These terms are used for convenient description, but do not imply any particular spatial orientation.

Conventional interlock circuits in fiber delivered laser systems include a resistor and are configured to detect resistance in order to monitor whether the circuit is within a predetermined range of a threshold resistance level. This conventional method of monitoring the circuit enables detection of catastrophic events such as mechanical and/or thermal destruction of the fiber. However, merely measuring for a threshold resistance as in the conventional interlock circuit does not provide the benefits that monitoring of the fiber environments at select locations and/or identify conditions that precede a fiber failure would. Conditions that precede a fiber failure may be quickly rising temperatures, erratic temperatures or sustained slightly higher than normal temperatures. Thus, the conventional method is limited to discovering failure conditions after the damage to the fiber has already occurred and does not help to prevent future fiber failures. What is needed is a simple method of detecting conditions in the environment around a fiber in a fiber delivered laser system prior to a catastrophic failure that is compatible with existing hardware and circuitry so that impending catastrophic failures can be detected and avoided in existing systems without expensive upgrades.

Temperature Sensitive Circuit

FIG. 1 illustrates an example fiber delivered laser system 100 including a circuit 102 for monitoring temperature. Laser system 100 includes a laser module 106 for generating a laser beam to be transmitted via fiber 124 to fiber coupler 128. Fiber coupler 128 is configured to couple fiber 124 to any of many different types of lasing devices such as a fiber-to-fiber coupler 114, a process head 112, fiber-to-fiber switch 116, test station 118 or the like, or any combination thereof. In an example, fiber coupler 128 includes a chamber 126 and housing 130 encasing at least a portion of circuit 102 and fiber 124. Circuit 102 is enclosed in fiber conduit 104 that runs through chamber 126 of fiber coupler 128. Fiber conduit 104 may also enclose fiber 124.

In an example, circuit 102 may be coupled to processor 120. Processor 120 may be disposed in laser module 106 which may include one or more laser diodes 134 coupled to fiber 124 configured to pump an optical beam along fiber 124. Processor 120 may be coupled to laser diode controller 136 configured to control the one or more laser diodes 134. Circuit 102 may extend from processor 120 to connector 108. Connector 108 may be configured to mate with a receptacle 110 which is configured to close circuit 102. Receptacle 110 may be disposed in any of a variety of devices compatible with fiber coupler 128, such as, for example, fiber-to-fiber coupler 114, process head 112, fiber-to-fiber switch 116, test station 118 or the like, or any combination thereof. Alternatively, circuit 102 may be closed without having to couple fiber coupler 128 to receptacle 110. For example, circuit 102 may be closed within connector 108.

A multitude of conditions may arise within fiber delivered laser coupler 128 that may result in mechanical or thermal damage to fiber coupler 128 and/or optical fiber 124. Such conditions include: backscattered light reflecting from a workpiece back into the fiber housing 130 and/or optical fiber 124, contamination within the fiber housing 130 or on the optical fiber 124, irregularities in the optical fiber 124, problems removing waste heat, mechanical stress on coupler 128 and/or fiber 124, photo-darkening of the optical fiber 124 and/or a variety of other fiber or mechanical failures.

In an example, multifunctional circuit 102 is configured to be temperature sensitive to enable temperature monitoring within fiber housing 130 of fiber coupler 128 in order to detect and prevent damage to fiber 124. Circuit 102 includes a temperature sensitive variable resistance element (TSVRE) 138. TSVRE 138 is a device configured to respond to temperature changes by varying resistance. In an example, the TSVRE may be a NTC (negative temperature coefficient) thermistor or a PTC (positive temperature coefficient) thermistor. Accordingly, processor 120 is configured to calculate temperatures based on resistance detected in circuit 102. Processor 120 may calculate temperatures according to a variety of methods for example based on an algorithm with the processor and/or by reference to a table mapping various resistance values to temperatures. Thus, a variety of temperature related conditions indicating that a failure is imminent in fiber-delivered laser system 100 (e.g., a fast temperature rise or a temperature outside of a predetermined range) can be detected by processor 120. Such conditions may be detected wherever TSVRE 138 is disposed and/or coupled. TSVRE 138 may be disposed in a variety of locations within chamber 126 in fiber coupler 128. Such locations may be selected based on susceptibility to temperature fluctuations and/or vulnerability to damage due to temperature fluctuations. In another example, TSVRE 138 may be disposed and/or coupled to a section of fiber-to-fiber coupler 114, process head 112, fiber-to-fiber switch 116, test station 118 or the like, or any combination thereof. Temperatures may be detected by circuit 102 in a section of fiber-to-fiber coupler 114, process head 112, fiber-to-fiber switch 116, test station 118 or the like, or any combination thereof where TSVRE 138 is located. Processor 102 may also be able to detect catastrophic failures based on resistance values measured in circuit 102 where, for example, circuit 102 is open due to a catastrophic thermal or mechanical event.

In an example, processor 120 may be programmed to initiate or trigger various actions based on detection in circuit 102 of a temperature outside of a pre-determined temperature, within a range of temperatures and/or upon detection of other temperature related fault indicators in laser system 100. Such actions may include disrupting, disabling and/or throttling one or more laser diodes 134 and/or initiating other evasive action to prevent or mitigate damage to any portion of laser system 100 by sending commands to laser diode controller 136 based on temperature data derived from readings of the temperature sensitive circuit 102. Furthermore, because circuit 102 can detect temperature via processor 120, temperature information can be stored in memory 132 and/or provided to a user via graphical user interface (GUI) 122. Such stored temperature data may be used to identify temperature behavior or patterns associated with laser damaging fault conditions which may be used to predict and respond to future fault conditions. For example, processor 120 may identify a pattern of temperature fluctuation associated with an identifiable fault condition (the fault condition may be automatically recognized by the processor 120 or user and associated with the pattern by the processor or manually associated by the user). Subsequently, during operation of the fiber-delivered laser system 100 processor 120 may detect the identified pattern to predict the fault condition. In an example, processor 120 is configured to identify a pattern of temperature fluctuation that precedes an identifiable fault condition and to associate the fault condition with the pattern where identifying the fault condition triggers the association. Again, identifying the fault condition may be automated or done manually by a user. Processor 120 may be further configured to trigger a laser diode 134 shutdown based on detecting the identified pattern to prevent the fault condition from causing a failure in the fiber-delivered laser system 100.

Likewise, stored data may be viewed by a user on GUI 122 and used to make administrative decisions such setting different temperature thresholds or manual over-ride conditions, for example.

Figure 2:
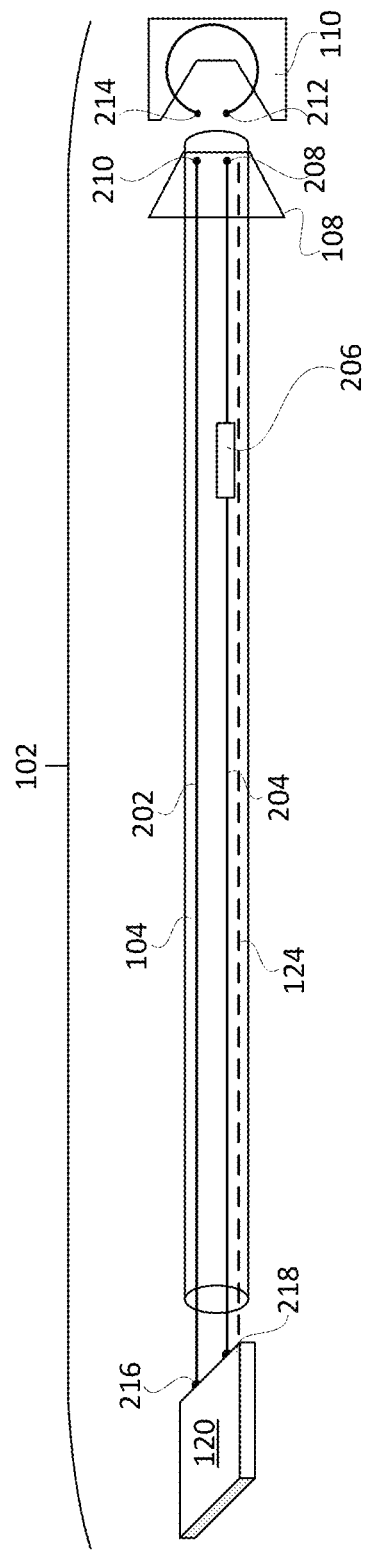
FIG. 2 illustrates an example of a circuit for enabling monitoring health of a fiber delivered laser.

FIG. 2 illustrates an example circuit 102 for monitoring temperature in a fiber-delivered laser system 100. In an example, circuit 102 includes a first wire 202 and a second wire 204. Second wire 204 includes a temperature sensitive variable resistance element such as a thermistor 206. In an example, thermistor 206 is in thermal contact with one or more locations of an inner chamber 126 of fiber coupler 128 (see FIG. 1). Thermistor 206 responds to temperature change at the one or more locations of inner chamber 126 by changing resistance.

In an example, connector 108 houses contacts 208 and 210. When fiber coupler 128 is mated to a device having a receptacle 110, contacts 208 and 210 couple to respective ones of contacts 212 and 214 to close circuit 102. Similarly, contact 216 of wire 202 and contact 218 of wire 204 are coupled to processor 120 closing circuit 102 on the processor 120 side. When circuit 102 is closed, processor 120 is configured to calculate temperature based on resistance in circuit 102. Processor 120 may comprise a mapping ability or other algorithm to determine temperature based on resistance values measured in circuit 102.

In an example, processor 120 may be programmed to trigger shutdown of laser system 100 in the event that a temperature outside of a threshold temperature is detected in circuit 102. Circuit 102 allows the temperature of the fiber to be monitored prior to shut-down. This visibility allows users to better avoid system shutdown due to fiber cable faults.

Backward Compatibility

In an example, circuit 102 may be backward compatible with conventional fiber-delivered laser systems programmed to read resistance in a multi-wire circuit. As discussed above, many conventional fiber-delivered laser systems have a two-wire detector system often referred to as an "interlock system." The conventional interlock system is connected to a processor that is configured to detect a range of resistance levels in the two-wire circuit to identify and shut down a laser system in the event of catastrophic failure. These conventional systems are agnostic to what is driving the resistance. In an example, circuit 102 is configured to integrate with or replace a conventional interlock circuit. In conventional laser systems catastrophic failures are indicated when the interlock circuit is open. Furthermore, conventional interlock circuits are considered 'closed' within a range of resistance values. Thus, circuit 102 can be configured to provide a resistance within the range expected by a pre-existing conventional processing algorithm in a conventional processor (rather than processor 120) by, for example, combining thermistor 206 with a resistor to keep the resistance in circuit 102 within an expected range for the conventional system. Therefore, in the event that circuit 102 is connected to a conventional system that is not programmed to determine temperatures based on resistance values, the conventional processor can still read resistance values from circuit 102 to identify catastrophic events as it is programmed to do. This enables users to use a connector 108 including circuit 102 on a legacy or conventional fiber-delivered lasers system to operate in the conventional way without having to upgrade the conventional system. Alternatively, a conventional laser system can easily be upgraded to utilize circuit 102 by adding a simple processor 120 configured to not only detect that a circuit is providing resistance within a predetermined range of resistance values to identify the presence of a failure but to also determine temperature based on the particular resistance values read.

Figure 3:
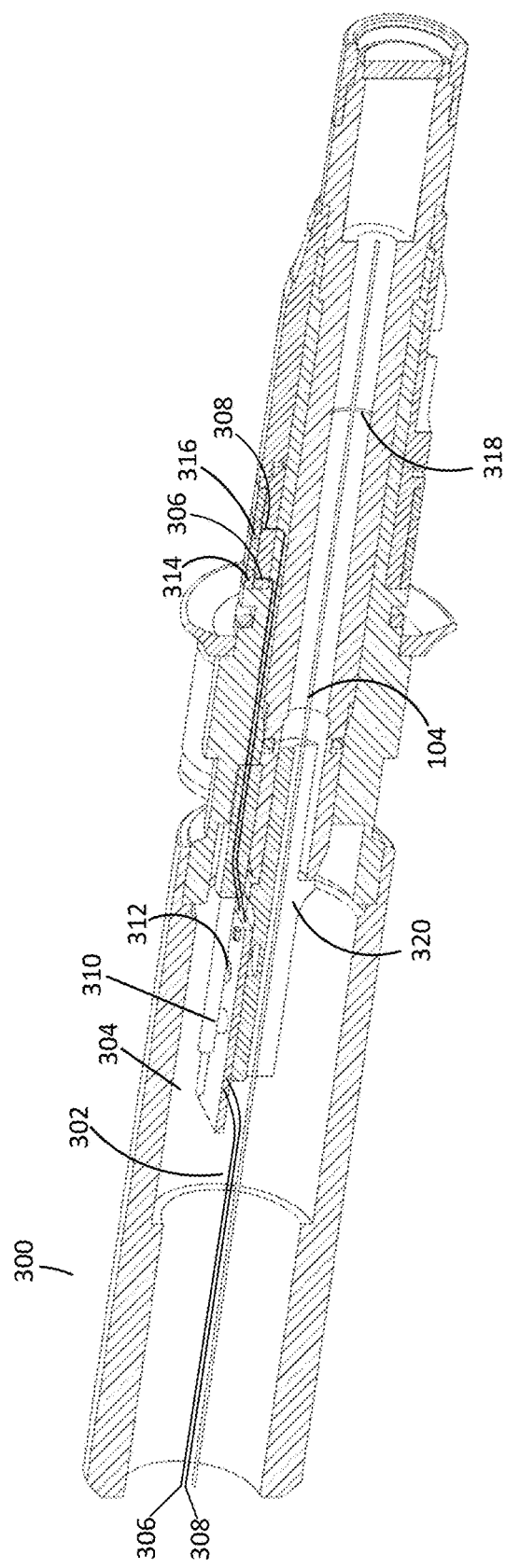
FIG. 3 is a schematic illustrating an example connector including a backward compatible circuit for detecting temperature in a fiber delivered laser system.

FIG. 3 is a schematic illustrating an example connector 300 including a backward compatible circuit 302 for detecting temperature configured to integrate with or replace an interlock circuit for a conventional laser system. Circuit 302 is configured to detect temperatures in connector 300 and to be backward compatible with conventional laser systems configured to read resistance values in an interlock circuit within a particular range to identify catastrophic failure modes.

In an example, circuit 302 is disposed within chamber 304. Circuit 302 comprises first wire 306, second wire 308 and thermistor 310. First wire 306 and second wire 308 are coupled to respective contacts 314 and 316 to engage receptacle 110 (see FIG. 1) and close circuit 102. Resistor 312 is connected to circuit 102 in series with thermistor 310. However, there may be a plurality of resistors 312 that may be connected in parallel and in series with thermistor 310. Resistor 312 may enable backward compatibility by adding resistance to circuit 302 to bring the resistance of circuit 302 to within a predetermined range expected by a legacy laser system (under normal operating conditions). The resistance range may be selected based on the particular laser application. In an example, the range may be between about 1.0 kΩ and 60.0 kΩ. In a laser system comprising a conventional interlock circuit, circuit 302 can be integrated without requiring an upgrade to the system and will still provide resistance values useful for the conventional processor to identify failure events. Such failure events may identified by detection of a resistance value outside of the expected range.

In an example, circuit 302 can also be used to detect temperature in an upgraded laser system. Detection of temperature within connector 300 is useful for a variety of reasons. For example, detecting temperature makes it possible to introduce user settable temperature limits and/or alerts as well as data logging of excessively hot or cold temperatures that may be useful to inform warranty decisions. Accordingly, processor 120 may create an event log identifying relevant temperature events. Such events may be communicated to an interested party (e.g., a manufacturer) via any of a variety of wireless or wireline communication systems. Detecting abnormal temperatures may also warn of an impending failure or other anomalies in the connector 300 or elsewhere in the laser system 100.

In an example, connector 300 is configured to dissipate unwanted light in several locations such as first light diffusing structure 318 and/or second light diffusing structure 320. Light dissipation can generate significant heat. Thermistor 310 may be attached to printed circuit board (PCB) 320 and potted in or near a first light diffusing structure 318 and/or a second light diffusing structure 320. Because thermistor 310 will change resistance based on the temperature of its environment, processor 120 may be configured to read the variable resistance and correlate the resistance to a particular temperature. This information may be stored in memory in a variety of data structures and claimed subject matter is not limited in this regard. Processor 120 may further store temperature data in memory 132 to be accessed by a user. Processor 120 may be programmed to respond to detection of a particular temperature, temperatures within a particular range and/or fluctuation of temperatures by sending commands to controller 136 to respond to the detected temperature readings. Responses may vary, for example, commands may be sent to one or more laser diodes 134 to shut down upon detection of temperatures outside of a predetermined threshold range or where wide fluctuations in temperatures are detected. These types of temperature readings may indicate impending failure of the laser modules and/or non-linearities in the fiber 124 causing hot spots.

Figure 4:
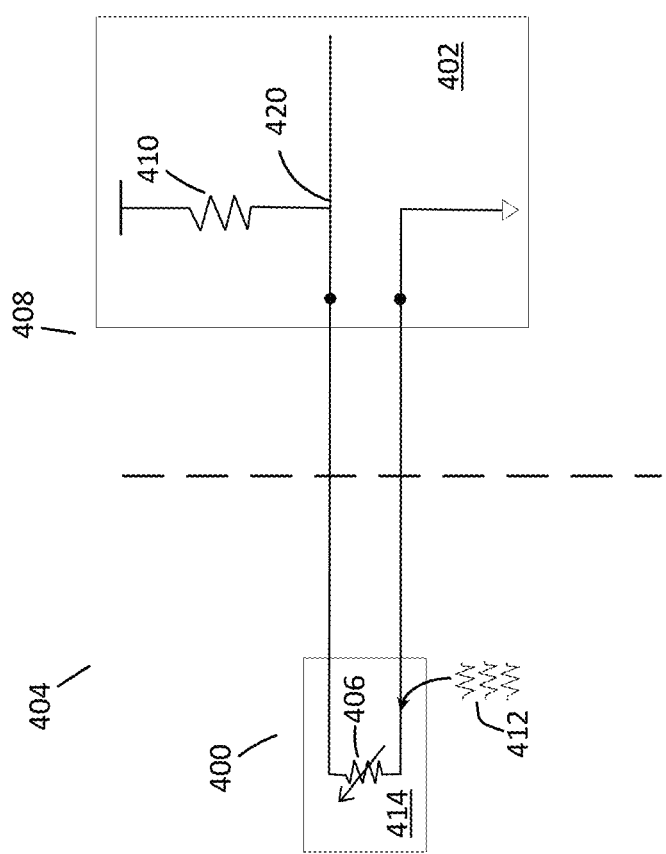
FIG. 4 illustrates an example of a circuit for enabling an example multifunctional circuit for monitoring fiber delivered laser fiber cable health.

FIG. 4 is a schematic of an example circuit 400 for detecting temperature in a fiber-delivered laser coupler. Circuit 400 runs from a fiber connector to a laser module that houses a processor 402. On a connector side 404 of circuit 400 a thermistor 406 is connected with a resistor 410 to create a voltage divider. Voltage at node 420 is read by the processor 402. In an example, processor 402 identifies the temperature of an environment within which thermistor 406 is located based on the voltage determined at node 420. Thermistor 406 may be located in a variety of areas within the fiber connector to identify areas of out-of-threshold temperatures. Optionally, thermistor 406 may be disposed on a PCB 414 coupled as a network of one or more resistors 412 where some resistors may be connected in parallel and/or in series. Optional resistor 412 is configured to provide a resistance in circuit 400 in a range expected by a legacy laser module as discussed above in order to maintain backward compatibility of circuit 400.

In view of the many possible embodiments to which the principles of the disclosed technology may be applied, it should be recognized that the illustrated embodiments are only preferred examples and should not be taken as limiting the scope of the disclosure. Alternatives specifically addressed in these sections are merely exemplary and do not constitute all possible alternatives to the embodiments described herein. For instance, various components of apparatuses described herein may be combined in function and use. We therefore claim all that comes within the scope and spirit of the appended claims.

We claim:

1. A fiber-delivered laser coupler, comprising:
   a fiber-delivered laser cable enclosed in a housing, wherein the housing includes a circuit; and
   a temperature sensitive variable resistance element (TSVRE) coupled to the circuit, wherein the TSVRE is in thermal contact with one or more locations within the housing and is configured to provide a resistance in the circuit associated with a temperature of the TSVRE, wherein the circuit is configured to couple to a processor programmed to determine a temperature of the TSVRE based on reading the resistance in the circuit.

2. The fiber-delivered laser coupler of claim 1, wherein the TSVRE is a NTC (negative temperature coefficient) thermistor or a PTC (positive temperature coefficient) thermistor.

3. The fiber-delivered laser coupler of claim 1, wherein the one or more locations within the housing are selected based on susceptibility to temperature fluctuations or vulnerability to damage due to temperature fluctuations.

4. The fiber-delivered laser coupler of claim 1, wherein the circuit is an interlock circuit for detecting mechanical failures, and wherein the TSVRE is connected in series with the interlock circuit.

5. The fiber-delivered laser coupler of claim 1, wherein the processor is a legacy processor that is part of a legacy laser system configured to couple to and operate with an interlock circuit for detecting only open or closed circuits based on resistance, and wherein the TSVRE is connected in series with one or more resistors to bring the resistance of the circuit to within a predetermined range expected by the legacy processor.

6. The fiber-delivered laser coupler of claim 1, wherein the processor is a legacy processor that is part of a legacy laser system configured to couple to and operate with an interlock circuit for detecting only open or closed circuits based on resistance, and wherein the TSVRE is connected in series and parallel with a plurality of resistors to bring the resistance of the circuit to within a predetermined range expected by the legacy processor.

7. The fiber-delivered laser coupler of claim 1, wherein a resistance of the TSVRE is associated with a temperature at the one or more locations within the coupler based on an algorithm for determining a temperature value based on a resistance value or a table mapping various resistance values to respective temperatures or combination thereof.

8. The fiber-delivered laser coupler of claim 1, wherein the processor is configured to log temperature data in memory based on identified temperatures derived by reading the resistance in the circuit.

9. The fiber-delivered laser coupler of claim 8, wherein the processor is configured to display logged temperature data on a display coupled to the processor in a graphical user interface.

10. The fiber-delivered laser coupler of claim 8, wherein the processor is configured to identify a pattern of temperature fluctuation and associate the pattern with an identifiable fault condition.

11. The fiber-delivered laser coupler of claim 10, wherein the processor is configured to identify the pattern to predict the fault condition.

12. The fiber-delivered laser coupler of claim 11, wherein the processor is configured to trigger a laser diode shutdown based on detecting the pattern to prevent the fault condition from causing a failure in the fiber-delivered laser coupler.

13. The fiber-delivered laser coupler of claim 1, wherein the processor is configured to compare temperature data to a threshold value or range and send a command to a laser diode controller based on the comparison.

14. The fiber-delivered laser coupler of claim 13, wherein the command is to trigger shut down of one or more laser diodes.

15. The fiber-delivered laser coupler of claim 1, wherein the processor is configured to compare temperature data to a threshold value or range and to trigger sending of a communication to a predetermined recipient based on the comparison.

16. The fiber-delivered laser coupler of claim 1, wherein the TSVRE is in a test station, a process head, a fiber switch, or a fiber coupler, or a combination thereof.

17. The fiber-delivered laser coupler of claim 8, wherein the processor is configured to identify a pattern of temperature fluctuation that precedes an identifiable fault condition and to associate the fault condition with the pattern.

* * * * *